United States Patent
Kaishita et al.

[11] Patent Number: 6,152,671
[45] Date of Patent: Nov. 28, 2000

[54] COMPONENT CONVEYING DEVICE AND METHOD

[75] Inventors: Nihei Kaishita; Akira Nemoto; Shigeki Takahashi, all of Omihachiman, Japan

[73] Assignee: Murata Manufacturing Co., Ltd., Nagaokakyo, Japan

[21] Appl. No.: 09/434,164

[22] Filed: Nov. 4, 1999

[30] Foreign Application Priority Data

Nov. 9, 1998 [JP] Japan ................................. 10-317169

[51] Int. Cl.$^7$ .................................................. H05K 13/02
[52] U.S. Cl. ........................... 414/403; 414/416; 414/810; 414/811; 29/740; 29/759; 221/268; 198/383; 198/750.1
[58] Field of Search ..................... 414/403, 414, 414/415, 416, 417, 810, 811; 29/740, 741, 759, 564.1; 221/259, 268; 198/382, 383, 390, 391, 534, 631.1, 750.1, 750.11, 750.13, 750.8, 832.1

[56] References Cited

U.S. PATENT DOCUMENTS

| | | | |
|---|---|---|---|
| 4,162,724 | 7/1979 | Shinjo ..................................... | 198/534 |
| 5,319,846 | 6/1994 | Takahashi et al. ................... | 414/416 X |
| 5,429,224 | 7/1995 | Kubo ..................................... | 198/391 X |
| 5,730,317 | 3/1998 | Mitsushima et al. ............... | 221/268 X |
| 5,733,093 | 3/1998 | Palm et al. ............................. | 414/417 |
| 5,755,548 | 5/1998 | Gaasch et al. ......................... | 414/415 |
| 5,809,639 | 9/1998 | Alvité et al. ............................. | 29/740 |

FOREIGN PATENT DOCUMENTS 8-48419  2/1996  Japan .

*Primary Examiner*—Robert P. Olszewski
*Assistant Examiner*—Gerald J. O'Connor
*Attorney, Agent, or Firm*—Burns, Doane, Swecker & Mathis, LLP

[57] ABSTRACT

A component conveying device is provided in which a lead component and a second component behind the lead component can be reliably separated and the lead component can be readily extracted with reduced error. The device includes a guide groove 6 for guiding and aligning the components P in a single line. A blade 5 is provided which moves back and forth in the groove. The components P are conveyed forward by moving the blade 5 forward at a low speed and then moving the blade backward in a high speed. A first stopper 31 holds a second component at the distal end of the device. A second stopper 41 stops the lead component P1 from moving back and forth, and a shutter 43 includes a magnet 49 for attracting the lead component. The second stopper is provided at a distal end portion of the guide groove 6. After the first stopper 31 holds the second component P2, the blade 5 moves forward by a predetermined distance, thereby conveying the lead component P1 forward with the blade 5 while the lead component P1 is attracted and held by the magnet 49 of the shutter 43. Thus, the lead component P1 is separated from the second component P2. Further, extraction of the lead component can be made easier by pulling the magnet 49 away from the lead component P1 just before the completion of the forward movement of the blade 5.

20 Claims, 9 Drawing Sheets

COMPONENT CONVEYING DEVICE AND METHOD

This application corresponds to Japanese Patent Application No. 10-317169, filed on Nov. 9, 1998, which is hereby incorporated by reference in its entirety.

1. Field of the Invention

This invention relates to a component conveying device, and more particularly, to an apparatus which separates a lead component from a second component among conveyed components by aligning the components in a single line.

2. Related Art

A conventional device for conveying small-sized components, such as chip components, includes a guide groove for conveying the components and an endless belt which is driven in an intermittent fashion. This configuration is shown in Unexamined Japanese Patent No. 8-48419, published on Feb. 20, 1996. In this device, a mechanism is provided for separating a lead component on the belt from a second component (which is positioned immediately behind the lead component), in order to extract the lead component. This separation mechanism provides a stopper which makes contact with a front end of the guide groove and which stops the lead component at a predetermined position. Movement of the components stops when the lead component contacts the stopper. A gap is forcibly provided between the lead component and the second component by holding the second component at a fixed position using a holding pin and by opening the stopper forward. The lead component is attracted to a permanent magnet on the stopper. The separated lead component is extracted by an extractor, such as a chip mounter.

However, in the above-mentioned separation mechanism, the lead component is held by the permanent magnet of the stopper when the belt stops and the lead component is pulled out forward by the magnetic force of the magnet. Thus, a frictional force may be generated between the component and the belt when the lead component is extracted and the attraction force between the permanent magnet and the component becomes weak. Therefore, the reliability of separation is not fully satisfactory.

Moreover, in the conventional separation mechanism, because the component is attracted to the stopper by magnetic force at the time of extraction, a mistake during extraction may occur when the component is extracted by an extraction apparatus.

SUMMARY OF THE INVENTION

Consequently, a general objective of this invention is to provide a component conveying device wherein a lead component can be reliably separated from a second component, wherein the lead component can be extracted easily, thereby reducing the risk of an extraction error.

In order to attain the above-mentioned objective, according to a first aspect of the present invention, a component conveying device is provided comprising a guide groove for guiding and aligning a single line of components having a magnetic part. The device includes a conveying member disposed on a bottom surface of the guide groove. The conveying member conveys the components forward by moving back and forth in the longitudinal direction of the groove. A driving device is provided for driving the conveying member back and forth. A first stopper is provided which operates in synchronism with the reciprocating movement of the conveying member, the first stopper holding a second component from the lead component among the components conveyed by the conveying member at a predetermined position along the guide groove. A second stopper is provided for stopping the lead component, the second stopper being disposed at a distal portion of the guide groove and being movable back and forth following the back and forth movement of the conveying member. A guidance member is provided having a magnetic force for attracting the magnetic part of the lead component, the guidance member being disposed at the distal portion of the guide groove and being movable back and forth with the reciprocating movement of the conveying member.

After the first stopper holds the second component, the conveying member moves forward by a predetermined distance, and the lead component is conveyed with the conveying member via the attraction of the lead component to the magnetic force provided by the guidance member. This movement separates the lead component from the second component. The lead component is stopped by means of the second stopper just before the completion of the forward movement of the conveying member, which allows the lead component to be separated from the guidance member by moving the guidance member further forward.

When a conveying member begins its forward movement, components on the conveying member are conveyed forward by a frictional force between the conveying member and the components. But only a lead component is conveyed forward because a first stopper operates to hold the second component from the lead component at a predetermined position. At this time, since a magnetic part of the lead component is attracted to the magnetic force of the guidance member, the lead component does not readily slip relative to the conveying member and the lead component is reliably conveyed forward. In this manner, the lead component is separated from the second component. When the lead component moves forward to the predetermined position, the second stopper stops the lead component. But since the guidance member moves further forward through contact with the conveying member, the guidance member is separated from the lead component and the magnetic force is removed from the lead component. In this state, when the lead component is extracted by an extractor, such as a chip mounter, an extraction error will not likely be generated. Further, since the stopping position of the lead component is regulated by the second stopper, the position of the lead component is made constant, which further improves the accuracy of the extraction operation.

The second stopper provides a stopping position of the lead component and also pushes the lead component back to a position in which it is in contact with the second component in the event that there is an extraction mistake and the lead component is not extracted. Consequently, the separation and extraction can be repeated many times, if necessary. Therefore, even when an extraction error occurs, the supply of the components can be continued without stopping the entire conveying device.

The magnetic force of the guidance member can be provided by attaching a permanent magnet to a part of the guidance member. Alternatively, the guidance member itself may be formed with a ferromagnetic material and may be magnetized to provide a magnetic force.

In case a magnet is used, the magnet can be attached to a portion of the guidance member which is adjacent to the lead component P1. Further, as mentioned above, the second component is held by the first stopper. As such, the lead component can be reliably separated from the second component when the conveying member moves forward.

There is preferably a difference between the forward movement velocity and the backward movement velocity of the conveying member. That is, a driving device drives the conveying member in a reciprocating fashion so that a speed of the backward movement is larger than a speed of the forward movement. The speed of forward movement of the conveying member is such that frictional force between the components and the conveying member causes the components to move forward with the conveying member. The speed of the backward movement of the conveying member is such that the components slip relative the conveying member, e.g., the frictional force is not sufficient to hold the components relative to the conveying member. Due to this configuration, the driving device can be simplified because the components can be conveyed in one direction simply by moving the conveying member in a reciprocating fashion. Further, the damage to the components is minimal because the components are not restrained. It should be noted that the speed of the forward movement of the conveying member preferably includes the abovedescribed situation in which the components move integrally with the conveying member, but also includes a situation in which some components slip to some extent relative to the conveying member. Further, the speed of the backward movement of the conveying member preferably includes the situation in which a frictional force does not retain any of the components, but also includes the situation in which some components are held to the conveying member to some extent.

The second stopper rotates in a horizontal plane. The second stopper includes an inclination surface which is rotated through a predetermined angle by contact with a distal end of the conveying member. Due to this configuration, the second stopper can be rotated by a predetermined angle in correspondence with the movement of the conveying member.

The guidance member can be formed as a shutter which covers a top surface of the lead component and provides an opening for access to a top surface of the lead component just before the completion of the forward movement of the conveying member. In this configuration, the guidance member can function as a shutter for preventing the lead component from jumping out of the guide groove.

The guidance member can alternatively comprise a member which rotates in a horizontal plane about the axis of the second stopper. An operating part of the guidance member is provided for rotating the third stopper in synchronism with the second stopper. The third stopper is rotated forward after the conveying member passes over the inclination surface of the second stopper. In this configuration, the second stopper and the third stopper rotate co-axially, thereby simplifying the structure of the device and reducing the size of the device.

BRIEF DESCRIPTION OF THE DRAWINGS

The foregoing and other, objects, features and advantages of the present invention will be more readily understood upon reading the following detailed description in conjunction with the drawings in which:

FIG. 4(b) shows a condition in which the component is held;

DETAILED DESCRIPTION OF INVENTION

FIGS. 1 to 8 show an example of a component conveying device according to the invention. Chip electronic components having a rectangular-parallelepiped shape with magnetic electrodes disposed on opposite ends thereof are used as components P, although the invention can be used with other types of components.

Figure 1:
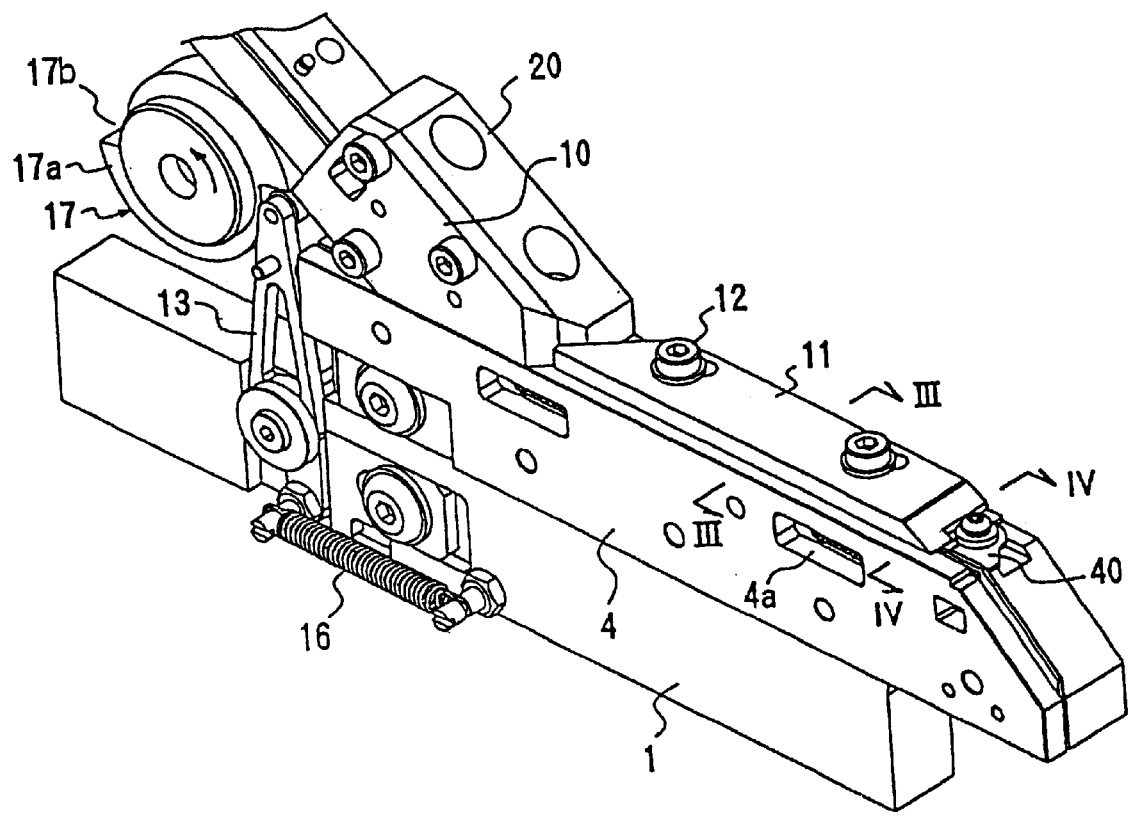
FIG. 1 is a perspective diagram of an example of the component conveying device according to this invention.
Figure 2:
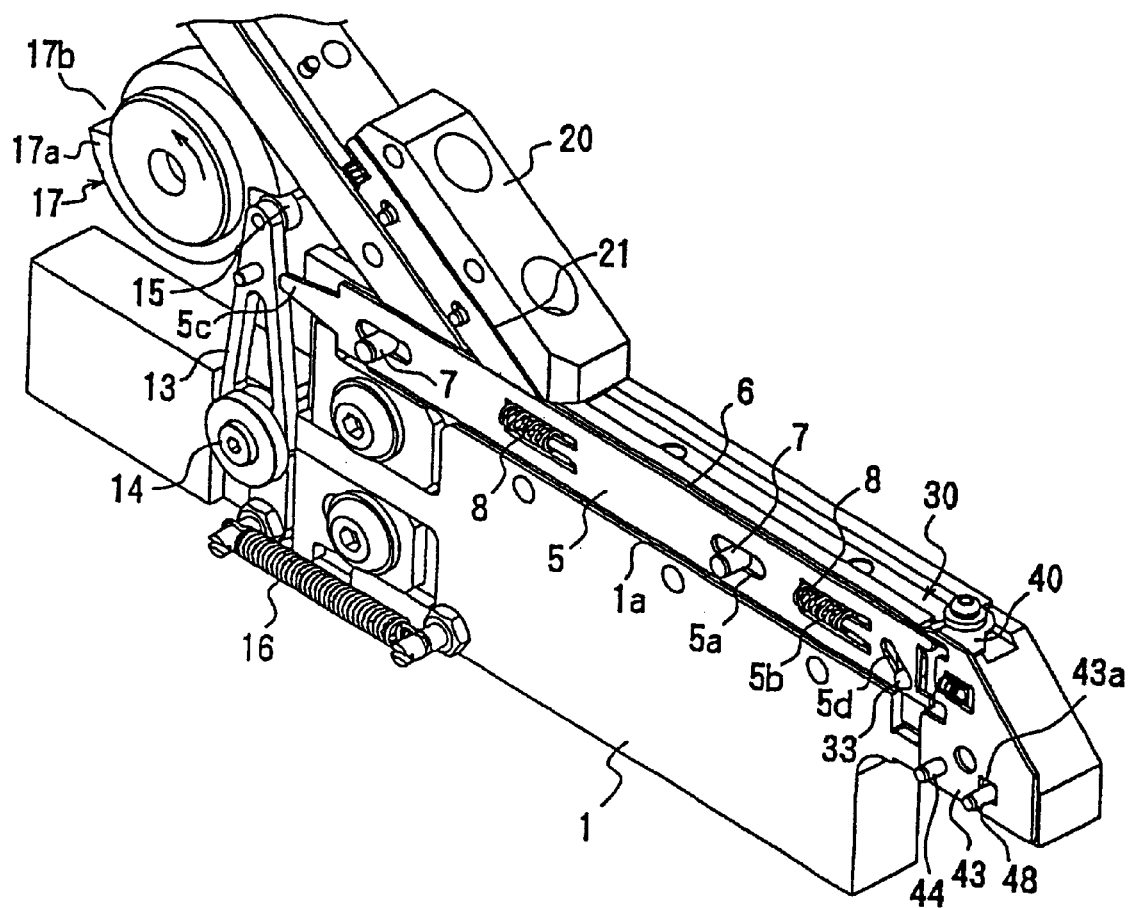
FIG. 2 is a perspective view showing a state in which front covers and an upper cover of the component conveying device shown in FIG. 1 are removed.

FIG. 1 shows a general view of the device. FIG. 2 shows a state of the device in which front covers 4 and 10 (mentioned later) and an upper-surface cover 11 are removed.

In the following discussion, the terms "front" or "distal" generally refer to portions of the device which are positioned closer to the right-hand side of the device (as depicted in FIGS. 1 and 2) than other reference portions of the device. The terms "rear," "back" or "proximal" generally refer to portions of the device which are positioned closer to the left-hand side of the device (as depicted in FIGS. 1 and 2) than other reference portions of the device. The term "longitudinal direction" generally indicates a direction pointing from the distal portion to the proximal portion, or vice versa. The term "horizontal" generally refers to a plane which is parallel to a surface on which the device rests. The term "top" refers to a portion of the device which is positioned above another reference portion of the device, as depicted in the figures. These terms are adopted as a matter of convenience merely to explain the placement of different portions of the device relative to other portions, and are not meant to otherwise limit the invention.

Figure 3:
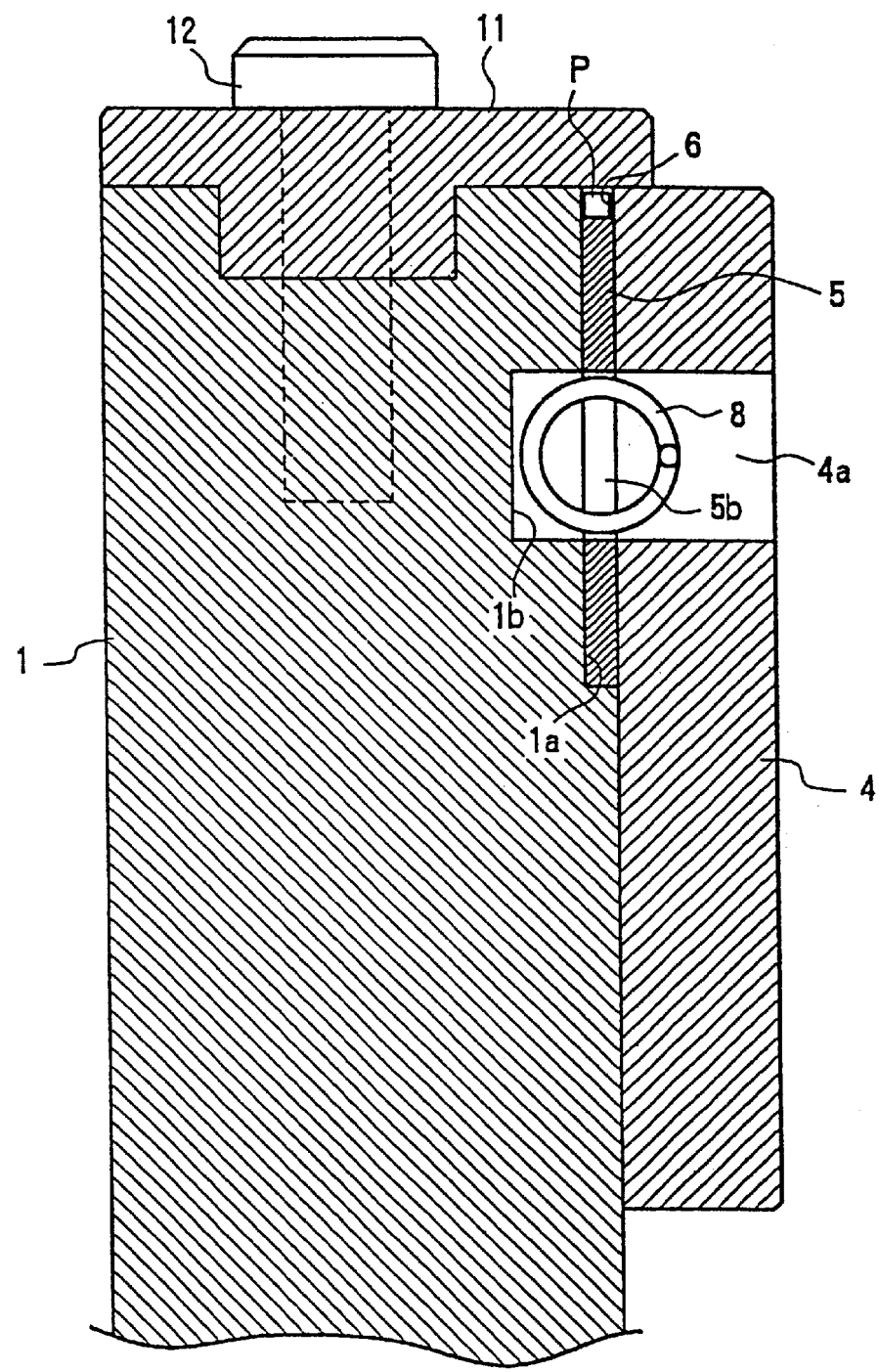
FIG. 3 is a sectional view taken by the line III—III in FIG. 1.

As shown in FIG. 3, a concave step 1a is formed on a front surface of a main body 1. A narrow space is formed by fixing a front cover 4 to a front surface of the main body 1. A blade 5, which serves as an example of a conveying member, is arranged in this space and can slide in a longitudinal direction. An upper cover 11 is fixed to an upper surface of the main body 1 by a screw 12 so that components P will not jump out when being conveyed. A guide groove 6 is provided for aligning the components P in a single line and for guiding the components. The groove 6 is formed by an inner side surface of the concave step 1a, an inner side surface of the front cover 4, the upper surface of the blade 5, and the lower surface of the upper cover 11.

The blade 5 is formed, for example, by a thin metal plate, and extends in a direction from the front of the apparatus to its back (referred to as the front to back or longitudinal direction). As shown in FIG. 2, a slot 5a, which extends in the front to back direction, and a spring accommodation hole 5b are formed. A guide pin 7 protruding from the main body 1 is inserted in the slot 5a and guides the blade 5 in the front to back direction. Moreover, a spring 8 is accommodated in the spring accommodation hole 5b. The radial sides of the spring 8 are engaged with a concave groove 1b formed in the main body 1 and an aperture hole 4a (shown in FIG. 3) is formed with the front cover 4. Further, a rear surface of the spring 8 is supported by the spring accommodation hole 5b. The front surface of the spring 8 is supported by a concave hole 1b and the front-end surface of the aperture hole 4a. The blade 5 is always energized backward.

A rear end part 5c of the blade 5 is in contact with a front surface of an intermediate lever 13, which, in turn, is rotatably attached to the main body 1 by the spring power of the spring 8. The center section of the intermediate lever 13 is rotatably supported with a screw 14. A roller 15 makes rolling contact with a circumferential surface of a cam 17 and is attached to an upper end part of the intermediate lever 13. One end of a spring 16 is fixed to the main body 1. The other end of the spring 16 is fixed to a lower end part of the intermediate lever 13. Therefore, the intermediate lever 13 is energized in a direction such that the upper end part of the roller 15 is placed in contact with the circumferential surface of the cam 17. A driving device for driving the blade 5 in a reciprocating fashion is constructed by the spring 8, the intermediate lever 13, and the cam 17.

The cam 17 has a rising part 17a and a trough part 17b, as shown in FIG. 1 and FIG. 2. The cam 17 is driven rotationally in a direction of an arrow at a fixed velocity by a motor (not illustrated). Therefore, the blade S moves forward at a low speed as the roller 15 of the intermediate lever 13 runs along the rising-part 17a of a cam 17. When the roller 15 falls into the trough 17b of the cam 17, the blade 5 is reversed at a high speed. The advance velocity of the above-mentioned blade 5 is set at a speed determined by the inclination of the rising part 17a of the cam 17 and the rotational velocity of the cam 17. The speed is selected such that the components P will remain on the blade 5 and move integrally with the blade 5 due to holding frictional force between the components P and the blade 5. Moreover, the reversing velocity of the blade 5 is set at a speed at which slippage is produced between the blade 5 and components P on the blade 5. That is, the speed is great enough to break the frictional force between the components P and the blade 5 so that the blade 5 and components no longer move integrally with each other. Thus, at the time of advance, the blade 5 is advanced at a low speed so that frictional force is maintained. At the time of reversing, the blade 5 is reversed at a high speed so that the slippage is produced. Therefore, the components P can be conveyed in one direction without providing a complicated mechanism for preventing the parts moving in a reverse direction.

An alignment apparatus 20 for aligning the components P in a single line is fixed diagonally to a rear upper surface of the main body 1. A chute groove 21 for sliding the components P along an inclination is formed by the alignment apparatus 20. A front cover 10 is fixed so that it covers a front surface of this chute groove 21. A lower end part of the chute groove 21 is connected with a rear end part of the guide groove 6 and the components P sliding on the chute groove 21 enter into the guide groove 6. At this point, since there is an angle variation between the chute groove 21 and the guide groove 6, the components P positioned in the lower end of the chute groove 21 advance toward the front of the device in the guide groove 6 and are prevented from returning to the chute groove 21.

Figure 4A:
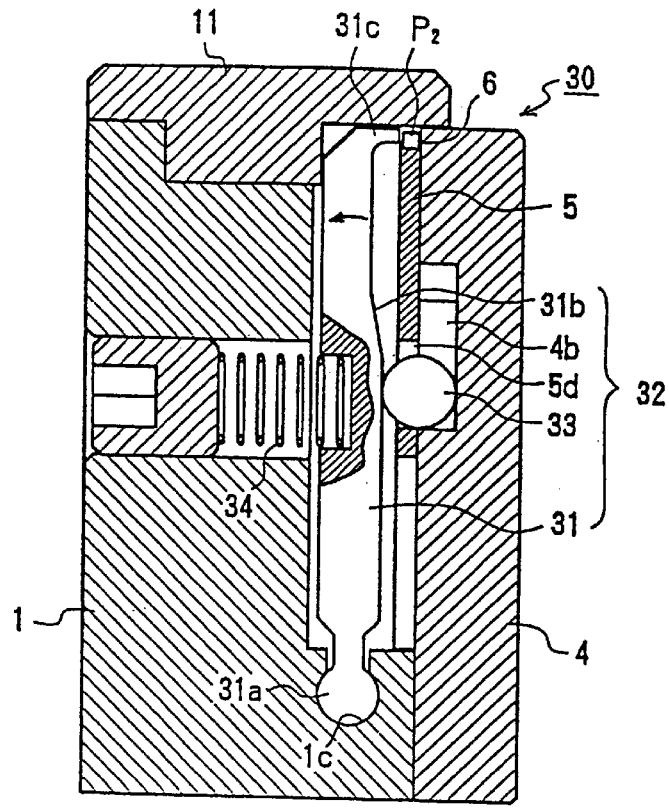
FIGS. 4(a) and 4(b) are sectional views taken along the line IV—IV in FIG. 1, wherein FIG. 4 (a) shows a condition in which the component is not held
Figure 4B:
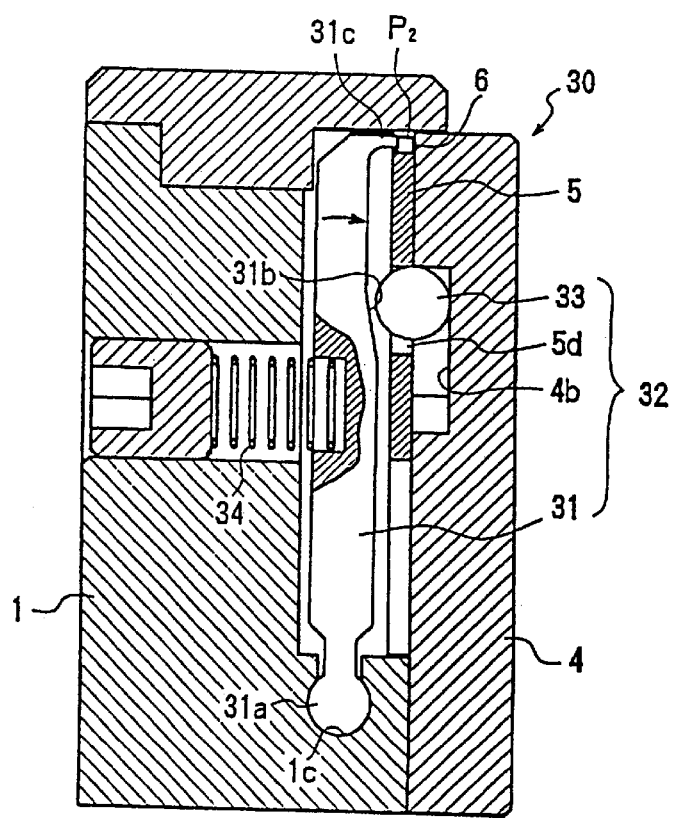
Figure 5:
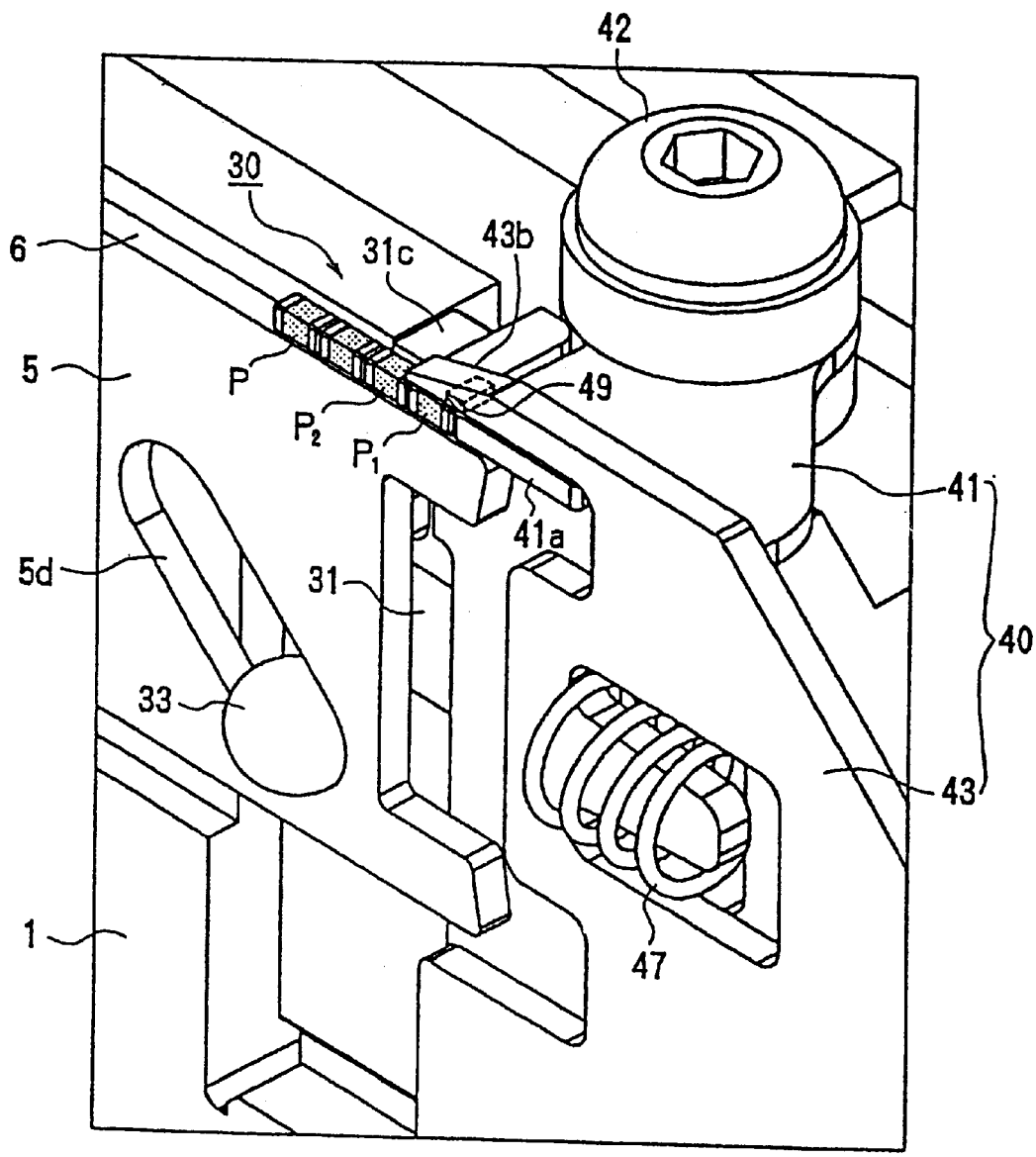
FIG. 5 is an enlarged perspective diagram of the distal portion of the device in a state before the component is separated.
Figure 6:
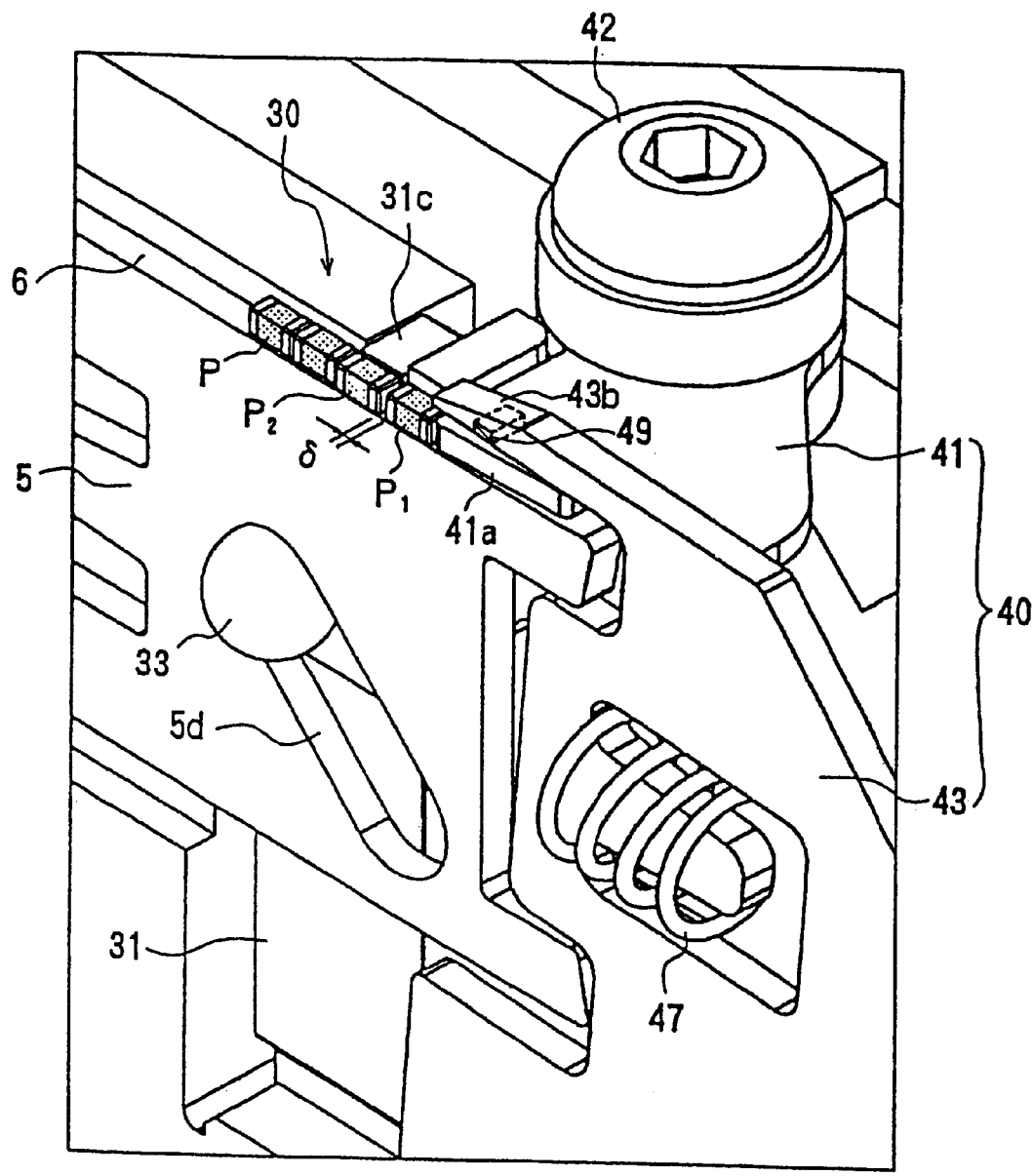
FIG. 6 is an enlarged perspective diagram of the distal portion of the device in a state after the component is separated.

A separation mechanism 30 is provided at a front end part of the guide groove 6. The separation mechanism 30 separates the conveyed lead component from the components behind the lead component. As shown in FIGS. 4 to 6, the separation mechanism 30 includes a first stopper 31 for holding a second component P2 from the lead component among the components P conveyed on the blade 5 and a synchronization device 32 for moving the first stopper 31 backward and forward in synchronism with the backward and forward movement of the blade 5. A lower end part 31a of the first stopper 31 is supported by a recess 1c of the main body 1, said recess 1c having an arc-shaped cross section. The first stopper 31 can rock in the width direction of the guide groove 6. The synchronization device 32 of this example includes a first hole 5d provided at a tip portion of the blade which is diagonally disposed with respect to the back to forward direction. The synchronization device also includes a second hole 4b which is formed in the back to forward direction on an inner side surface of a front surface cover 4 for guiding a side surface of the blade 5. A ball 33 is inserted over the first hole 5d and the second hole 4b. An inclination surface 31b is provided along the edge of the first stopper 31 and is in contact with the ball 33. A spring 34 is provided for energizing the first stopper 31 in the direction in which the components are held, e.g., against the front surface cover 4.

When the blade 5 is fully reversed, as shown in FIG. 4 (a) and FIG. 5, the ball 33 is positioned in the lower end part of the second hole 4b and the first hole 5d. Therefore, the ball 33 is positioned below the inclination surface 31b of the first stopper 31 and hence pushes the first stopper 31 in the opening direction, e.g., away from the front surface cover 4. As a result, the component P2 in the guide groove 6 is not held by the first stopper 31.

When the blade 5 moves forward, because of the angle difference between the first hole 5d and the second hole 4b, the ball 33 moves upwards as shown in FIG. 4 (b) and FIG. 6 and the ball 33 engages the inclination surface 31b of the first stopper 31. Therefore, the opening push-force applied to the first stopper 31 is released and the first stopper 31 moves in a closing direction (e.g., toward the front surface cover 4) by force of the spring 34. Consequently, the first stopper 31 holds the second component P2 between the tip end portion 31c of the first stopper 31 and the inner surface of the guide groove 6.

Furthermore, when the blade 5 reverses, the ball 33 moves downward due to the angle difference between the first hole 5d and the second hole 4b. The ball 33 then again runs below the inclination surface 31b of the first stopper 31, thereby pushing the first stopper 31 open again. Therefore, the second component P2 in the guide groove 6 can move freely.

As shown in FIG. 5 and FIG. 6, an escape mechanism 40 is provided at the front end of the guide groove 6. This escape mechanism 40 stops the lead component P1 at a constant position when the lead component P1 is separated from the second component P2. Further, this mechanism 40 pushes the lead component P1 back so that a gap (delta) is provided between the lead component P1 and the second component P2 behind the lead component P1 when an extraction error occurs.

Figure 7:
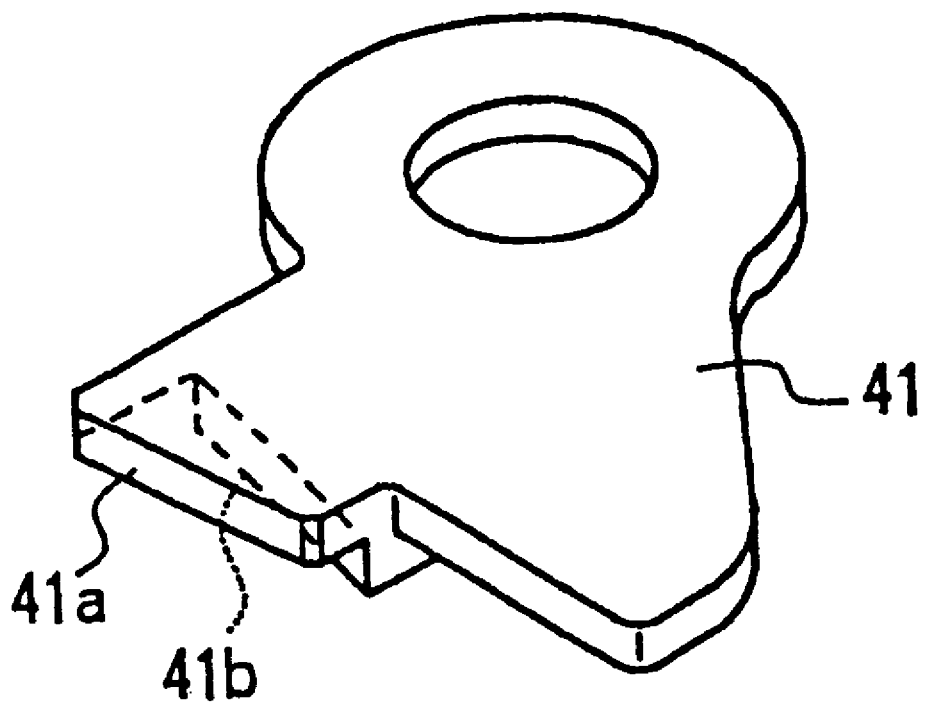
FIG. 7 is a perspective diagram of a second stopper.

The escape mechanism 40 includes a second stopper 41 which horizontally rotates about a centering a screw 42. A shutter (guidance member) 43 is provided which is movable backward and forward centering a shaft 44 (see FIG. 2). The second stopper 41 is energized back (in the opposite direction to the blade 5) by a spring 45 (see FIG. 8) and stops when it makes contact with a stoppage surface 46. A projection 41a for stopping the lead component P1 and an inclination surface 41b which is below the projection 41a are provided by the second stopper 41, as shown in FIG. 7. The distal end of the blade 5 contacts the inclination surface 41b. The shutter 43 is energized back (in the opposite direction to the blade 5) by a spring 47. A pin 48 protrudes from the main body 1 and is inserted in a hole 43a (see FIG. 2) of the shutter 43. Using this configuration, the shaking angle of the shutter 43 is regulated. A cover part 43b which covers an upper surface of the lead component P1 is integrally formed in an upper end part of the shutter 43. The cover part 43b covers the upper side of the lead component P1 just before the lead component P1 is extracted from the guide groove 6, thereby preventing the lead component P1 from jumping out from the guide groove 6. A magnet 49 for attracting the lead component P1 is fixed to the lower surface of the cover part 43b.

The operating principle of the above-mentioned separation mechanism 30 and the escape mechanism 40 is explained with reference to FIG. 8. In order to facilitate understanding, the shapes of selected parts are simplified in FIG. 8.

Figures 8A, 8B, 8C, 8D:
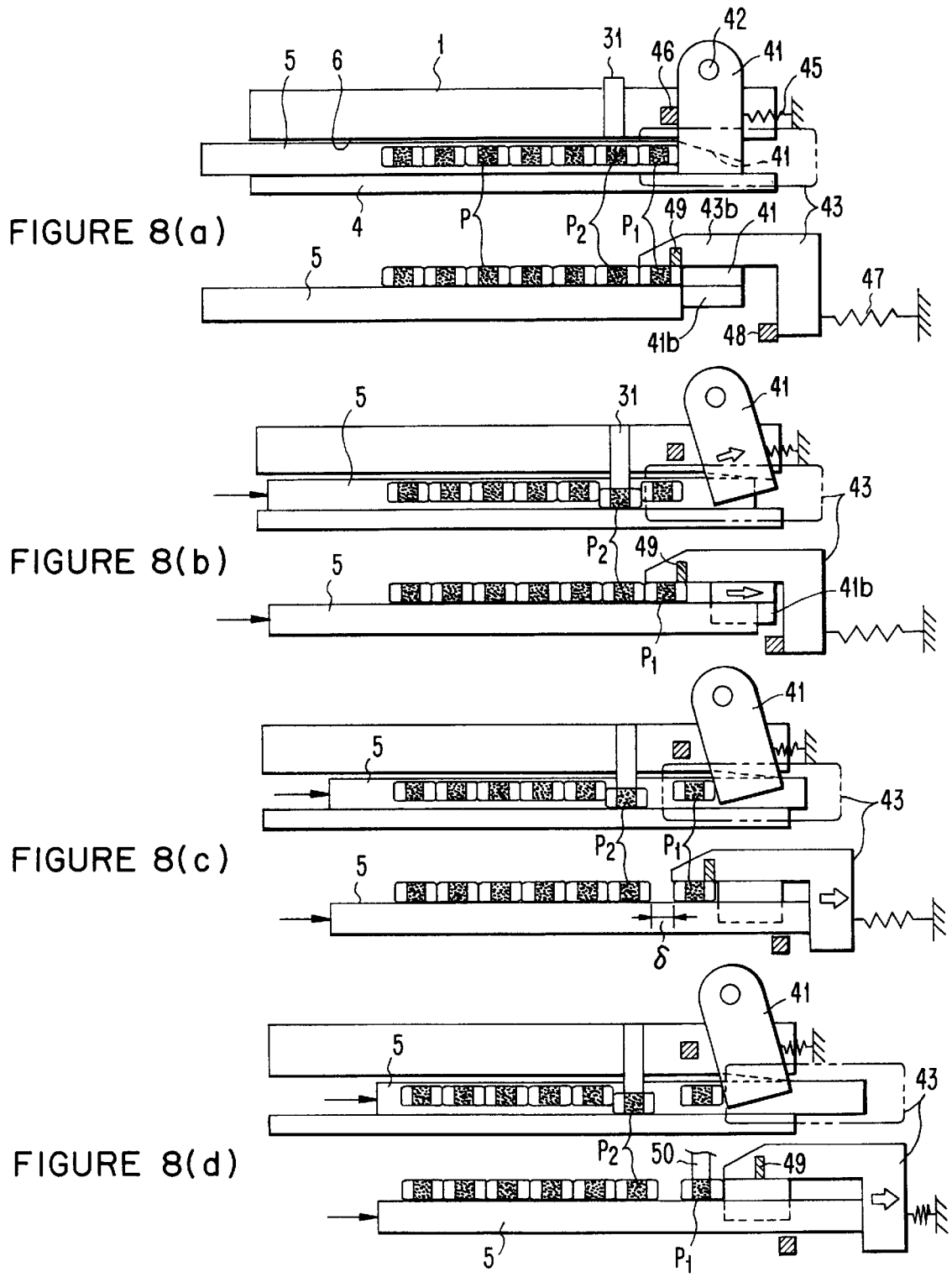
FIGS. 8(a) to 8(d) are explanatory drawings showing the principle of the operation of the component conveying device shown in FIG. 1.

FIG. 8(a) shows an initial position. The lead component P1 stops, being in contact with the second stopper 41. Both the second stopper 41 and the shutter 43 are energized backward by springs 45 and 47 and the backward movement thereof is limited when contact is made with the stopping surface 46 and the pin 48. In this state, the first stopper 31 operates and the second component P2 is immobilized by being pushed against the side surface of the guide groove 6. The first stopper 31 operates in this condition. Therefore, advance of the components behind the lead component is prohibited.

FIG. 8(b) shows a state in which the blade 5 moves forward by a small amount. At this stage, a tip portion of the blade 5 pushes the inclination surface 41b of the second stopper 41. Due to this force, the second stopper 41 rotates forward. The blade 5 moves forward toward the shutter 43. However, the lead component P1 is attracted to the magnet 49 provided on the shutter 43, which stops the lead component P1 in an initial position.

FIG. 8(c) shows a state in which the blade 5 is advanced further. At this time, a tip portion of the blade 5 passes the inclination surface 41b of the second stopper 41 and makes the second stopper 41 rotate forward to an upper limit. Further, since the blade 5 pushes the shutter 43 forward, the lead component P1 is conveyed forward by the frictional force of the blade 5 and the attraction force of the magnet 49. On the other hand, since the second component P2 is constrained by the first stopper 31, a gap (delta) is produced between the lead component P1 and the second component P2. Hence, the lead component P1 becomes separated from the second component P2. In addition, the lead component P1 is in contact with the second stopper 41 during advance of the blade 5 and is constrained thereby.

FIG. 8(d) shows a state in which the blade 5 moves forward to a termination position. At this time, the blade 5 only slides on the inclination surface 41b. Therefore, the second stopper 41 does not rotate but maintains a fixed position. Therefore, the lead component P1 stops, being in contact with the second stopper 41. On the other hand, because the shutter 43 is pushed by the blade 5 and moves forward, the magnet 49 separates from the lead component P1. In this state, the lead component P1 can be simply extracted by an extractor 50, such as a chip mounter (not shown). At this point, since the lead component P1 is separated from the second component P2, there is little possibility that the lead component P1 and the second component P2 will be extracted accidentally together, and moreover, since the lead component P1 is pulled apart from the magnet 49, the attraction force of the magnet 49 does not affect the separation of the lead component P1 by the extractor 50. In the above-described configuration, it is unlikely that an extraction mistake will be generated. Therefore, a reliable separation and reliable extraction can be perform-ed.

After extracting the lead component P1, in order to cancel the constraint of the first stopper 31, the blade 5 reverses at a high speed using the mechanism described above. At this time, the blade 5 reverses at a velocity at which component slippage occurs so that the components P will not move back together with the blade 5. As a result, the configuration of the apparatus returns to the state shown in FIG. 8(a). Further, in the state shown in FIG. 8(d), even if the lead component P1 somehow cannot be extracted, the lead component P1 is pushed back to the condition of FIG. 8(a) by the second stopper 41. Hence, the lead component P1 can be separated again by the next advance operation of the blade 5.

Figure 9A:
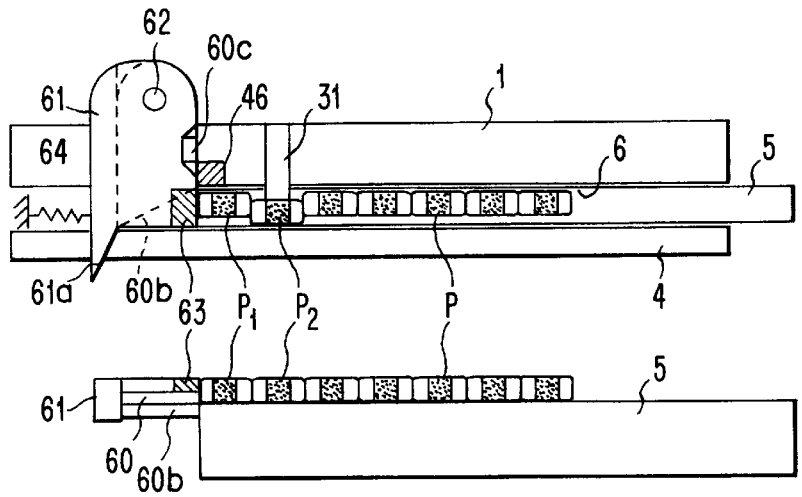
FIGS. 9(a) to 9(c) are explanatory drawings showing the principle of the operation of a second example of a component conveying device according to this invention.
Figure 9B:
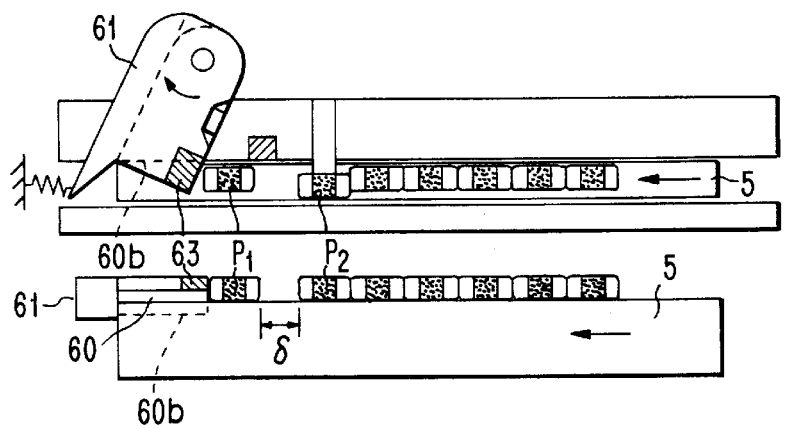
Figure 9C:
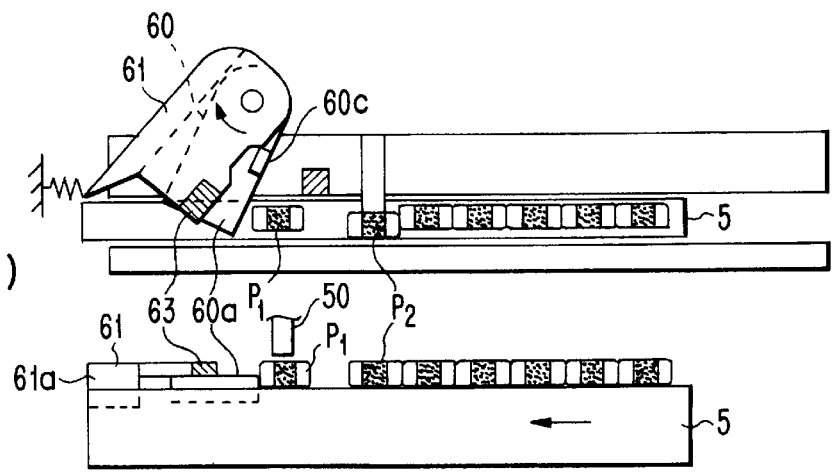

FIGS. 9(a)–(c) show a second example of a component conveying device according to the present invention. Parts which are identical to the FIG. 8 embodiment are assigned the same reference numerals, and detailed explanation thereof is omitted.

In this example, a second stopper 60 and a third stopper (guidance member) 61 are provided. These stoppers rotate horizontally about an identical shaft 62. The second stopper 60 includes a projection 60a for stopping the lead component P1 and an inclination surface 60b below the projection 60a. These features function in the same way as the second stopper 41 of the first example. A protrusion (operating part) 60c protrudes from an upper surface of the side portion of the second stopper 60. This protrusion 60c enables synchronous rotation of the third stopper 61 with the second stopper 60. The magnet 63 which attracts the lead component P1 is fixed to the rear of the tip end of the third stopper 61. Also, a contact portion 61a is integrally formed at the front tip end of the third stopper 61. This contact portion 61a contacts the tip of the blade 5.

In addition, in this example, spring 64 is provided for energizing the third stopper 61 backward. Because the second stopper 60 mates with the third stopper 61, a spring for the second stopper is not provided. Moreover, it is desirable to provide a predetermined rotational resistance for the second stopper 60 so that it may not freely rotate.

The operation of the above-mentioned component conveying device is explained with reference to FIGS. 9(a) to 9(c).

First, FIG. 9(a) shows an initial position of the conveying device. In this state, the second and the third stoppers (60 and 61) are energized backward by the spring 64 and stop 60c. The stoppers are also in contact with the stoppage surface 46 in this state. Further, the first stopper 31 operates to push the second component P2 against the guide groove 6 and to immobilize the second component P2. In this condition, the lead component P1 is also attracted by the magnet 63 of the third stopper 61.

FIG. 9(b) shows a state of the device in which the blade 5 advances a predetermined distance further. The blade 5 is in contact with the inclination surface 60b of the second stopper 60 and thus forces the second stopper 60 to rotate. The third stopper 61 mates with the second stopper 60 via the protrusion 60c and therefore synchronously rotates with the second stopper 60. Therefore, the lead component P1 is conveyed forward by the frictional force between the component P1 and the blade 5 and the attraction force of the magnet 63. The lead component P1 thereby becomes separated from the second component P2.

FIG. 9(c) shows a state of the device in which the blade 5 moves forward to a termination position. At this time, since the blade 5 only slides over the inclination surface 60b of the second stopper 60, the second stopper 60 no longer rotates and maintains a predetermined position. On the other hand, because the contact part 61a of the third stopper 61 is pushed forward by the blade 5, the magnet 63 separates from the lead component P1. In this condition, the lead component P1 can be easily extracted by an extractor 50, such as a chip mounter (not shown).

The invention is not limited to the above-mentioned examples. For example, the driving device for providing the reciprocating drive of the conveying member (e.g., the blade 5) is not be restricted to the combination of the spring 8, the intermediate lever 13 and the cam 17, as shown in FIG. 2. For instance, the intermediate lever 13 can be omitted and the rear end part of the blade 5 can be directly connected to the circumferential surface of the cam 17. Moreover, instead of the cam 17, another mechanism, such as a rack-and-pinion mechanism, can be adopted. The driving source is not be restricted to rotational-movement mechanisms, such as a motor. For example, the driving mechanism can linearly move the blade 5.

Further, the above-described device conveys the components in one direction using the friction between the conveying member (blade) and the components. However, instead of this method, for example, a reversing prevention mechanism or the like can be provided at the rear part of the guide groove to accomplish the same effect.

Further, the above-described device uses a first stopper 31 which performs an opening and closing operation in the width direction of the guide groove 6 and holds the components between the first stopper 31 and the side surface of the guide groove 6. Alternatively, the first stopper 31 can hold both side surfaces of the component. Further, the attraction force used to hold the second component can be maintained by air suction.

Furthermore, the conveying member is not restricted to a blade. Any member can be used as long as it can provide a bottom surface for the guide groove and perform a forward and rearward movement. The weight of the device can be reduced by using a thin member, such as a blade. This is beneficial because it reduces the inertial influence when the conveying member is reciprocated.

The conveyed components are not restricted to rectangularly shaped components, but can be components of any shape as long as the component can be conveyed in the guide groove by aligning the components in a single line.

In summary, according to a first aspect of the invention, the conveying member moves forward by a predetermined distance after the first stopper holds the second component. Because of this, the lead component is conveyed forward together with the conveying member with the lead component attracted by the magnetic force of the guidance member. This enables the lead component to be reliably separated from the consecutive components. Moreover, since the lead component is separated from the guidance member just before the completion of the forward movement of the conveying member, the magnetic force is not applied to the lead component at this time, thereby reducing problems in extracting the lead component.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

What is claimed is:

1. A component conveying device for conveying a line of components, including a first component at a lead position in the line and a second component immediately behind the first component, comprising:

a guide groove configured to guide and align the components in the single line;

a conveying member disposed on a bottom surface of the guide groove, said conveying member configured to convey the components in a longitudinal direction of the device by reciprocating back and forth in the longitudinal direction;

a driving device configured to drive the conveying member back and forth;

a first stopper configured to move in synchronism with the reciprocating movement of the conveying member, said first stopper configured to hold the second component at a predetermined position in the guide groove;

a second stopper configured to stop the first component, said second stopper disposed at a distal portion of the guide groove and configured to move back and forth with the reciprocating movement of the conveying member;

a guidance member having an attractive force for attracting the first component, said guidance member disposed at the distal portion of the guide groove and configured to move back and forth with the reciprocating movement of the conveying member, wherein after the first stopper holds the second component, the conveying member moves by a predetermined distance forward toward the distal end of the device, and the lead component is conveyed with the conveying member via the attraction force provided by the guidance member, thereby separating the first component from the second component, wherein the first component is stopped by the second stopper just before the completion of the forward movement of the conveying member, and the first component is separated from the guidance member by advancing the guidance member further forward.

2. A component conveying device according to claim 1, wherein said driving device is configured to drive the conveying member in reciprocating fashion so that the speed at which the conveying member moves backward is larger than the speed at which the conveying member moves forward, wherein when moving forward, a frictional force between the components and the conveying member enables the components to move integrally with the conveying member, and when moving backward, the frictional force is insufficient to hold the components to the conveying member, such that the components slip over the surface of the conveying member.

3. A component conveying device according to claim 2, wherein said second stopper is configured to rotate about an axis in a horizontal plane, said second stopper having an inclination surface which is configured to make contact with a distal end of the conveying member and rotate by a predetermined angle through the advance of the conveying member.

4. A component conveying device according to claim 2, wherein said guidance member comprises a shutter which covers a top surface of the first component and provides an opening for access to a top surface of the first component just before the completion of the forward movement of the conveying member.

5. A component conveying device according to claim 1, wherein said second stopper is configured to rotate about an axis in a horizontal plane, said second stopper having an inclination surface which is configured to make contact with a distal end of the conveying member and rotate by a predetermined angle through the advance of the conveying member.

6. A component conveying device according to claim 5, wherein said guidance member comprises a shutter which covers a top surface of the first component and provides an opening for access to a top surface of the first component just before the completion of the forward movement of the conveying member.

7. A component conveying device according to claim 5, wherein said guidance member comprises a third stopper which is configured to rotate in a horizontal plane around the axis of the second stopper, the guidance member including an operating part for rotating the third stopper in synchronism with the second stopper, wherein the second and third stoppers are configured such that the third stopper can be rotated further forward after the conveying member passes over the inclination surface of the second stopper.

8. A component conveying device according to claim 7, wherein the third stopper includes a contact portion which is formed at a front tip end of the third stopper, wherein said contact portion contacts the conveying member after the conveying member passes over the inclination surface of the second stopper.

9. A component conveying device according to claim 1, wherein said guidance member comprises a shutter which covers a top surface of the first component and provides an opening for access to a top surface of the first component just before the completion of the forward movement of the conveying member.

10. A component conveying device according to claim 1, wherein the attraction force provided by the guidance member is a magnetic force.

11. A method of conveying a line of components, including a first component at a lead position in the line and a second component immediately behind the first component, comprising the steps of:
  aligning components in the single line and guiding the components into a guide groove;
  making the components move forward using a conveying member which moves back and forth in a longitudinal direction of the guide groove, said conveying member being disposed on a bottom surface of the guide groove;
  holding the second component at a predetermined position of the guide groove by a first stopper which operates in synchronism with the back and forth movement of the conveying member;
  attracting the first component using a guidance member having an attractive force which is provided at the distal portion of the guide groove and is movable back and forth following the back and forth movement of the conveying member;
  separating the first component from the second component by making the conveying member move forward by a predetermined distance and by conveying the first component together with the conveying member forward by attracting the lead component with the attraction force provided by the guidance member;
  stopping the first component by a second stopper which is provided at a distal portion of the guide groove and which is movable back and forth following the back and forth movement of the conveying member; and
  separating the first component from the guidance member, wherein the conveying member makes the guidance member move further forward in a state such that the first component is stopped by the second stopper just before the completion of the forward movement of the conveying member.

12. A method of conveying components according to claim 11, wherein the conveying member is driven in reciprocating fashion so that the speed at which the conveying member moves backward is larger than the speed at which the conveying member moves forward, wherein when moving forward, a frictional force between the components and the conveying member enables the components to move integrally with the conveying member, and when moving backward, the frictional force is insufficient to hold the components to the conveying member, such that the components slip over the surface of the conveying member.

13. A method of conveying components according to claim 12, wherein the second stopper rotates about an axis in a horizontal plane, the second stopper having an inclination surface which is configured to make contact with a distal end of the conveying member and rotate by a predetermined angle through the advance of the conveying member.

14. A method of conveying components according to claim 12, wherein the guidance member comprises a shutter which covers a top surface of the first component and provides an opening for access to a top surface of the first component just before the completion of the forward movement of the conveying member.

15. A method of conveying components according to claim 11, wherein the second stopper rotates about an axis in a horizontal plane, the second stopper having an inclination surface which is configured to make contact with a distal end of the conveying member and rotate by a predetermined angle through the advance of the conveying member.

16. A method of conveying components according to claim 15, wherein the guidance member comprises a shutter which covers a top surface of the first component and provides an opening for access to a top surface of the first component just before the completion of the forward movement of the conveying member.

17. A method of conveying components according to claim 15, wherein the guidance member comprises a third stopper which is configured to rotate in a horizontal plane around the axis of the second stopper, the guidance member including an operating part for rotating the third stopper in synchronism with the second stopper, wherein the third stopper can be rotated further forward after the conveying member passes the inclination surface of the second stopper.

18. A method of conveying components according to claim 17, wherein the third stopper includes a contact portion which is formed at a front tip end of the third stopper, wherein said contact portion contacts the conveying member after the conveying member passes over the inclination surface of the second stopper.

19. A method of conveying components according to claim 11, wherein the guidance member comprises a shutter which covers a top surface of the first component and provides an opening for access to a top surface of the first component just before the completion of the forward movement of the conveying member.

20. A method of conveying components according to claim 11, wherein the attraction force provided by the guidance member is a magnetic force.

* * * * *